United States Patent
Krzentz

[11] Patent Number: 5,822,250
[45] Date of Patent: Oct. 13, 1998

[54] CIRCUIT AND PROCESS FOR AUTOTRIM OF EMBEDDED THRESHOLD VOLTAGE REFERENCE BIT

[75] Inventor: Steven V. Krzentz, Dallas, Tex.

[73] Assignee: Texas Instruments Incorporated, Dallas, Tex.

[21] Appl. No.: 918,410

[22] Filed: Aug. 26, 1997

Related U.S. Application Data

[60] Provisional application No. 60/025,105 Aug. 30, 1996.

[51] Int. Cl.⁶ .................................................. G11C 16/04
[52] U.S. Cl. ............................... 365/185.29; 365/185.18; 365/185.2; 365/185.21
[58] Field of Search ..................................... 365/218, 201, 365/185.01, 185.14, 185.2, 185.21, 185.29, 185.18

[56] References Cited

U.S. PATENT DOCUMENTS

| | | | |
|---|---|---|---|
| 4,460,982 | 7/1984 | Gee et al. | 365/189 |
| 5,444,656 | 8/1995 | Bauer et al. | 365/189.01 |
| 5,608,669 | 3/1997 | Mi et al. | 365/185.19 |
| 5,608,679 | 3/1997 | Mi et al. | 365/201 |
| 5,721,704 | 2/1998 | Morton | 365/189.23 |
| 5,729,494 | 3/1998 | Gotou et al. | 365/185.24 |

*Primary Examiner*—David C. Nelms
*Assistant Examiner*—Tuan Nguyen
*Attorney, Agent, or Firm*—Robby T. Holland; Richard L. Donaldson

[57] ABSTRACT

A circuit (10, 40) and method for autotrim of an embedded threshold voltage reference bit are provided. A FAMOS cell (12, 42) in an integrated circuit chip provides the embedded threshold voltage reference bit. The FAMOS cell (12, 42) is first programmed to a threshold voltage above a desired threshold voltage. The FAMOS cell (12, 42) is then erased to lower the threshold voltage. After erasing, the FAMOS cell (12, 42) is tested to determine whether the threshold voltage is at a desired voltage level. The erasing and testing are accomplished automatically as an on-chip process in an integrated circuit chip. The testing can be based upon a comparison with an output of an internal reference circuit (50) that is responsive to the embedded threshold voltage reference bit. The testing can also be based upon a comparison to an external voltage input or an internal voltage reference.

13 Claims, 2 Drawing Sheets

CIRCUIT AND PROCESS FOR AUTOTRIM OF EMBEDDED THRESHOLD VOLTAGE REFERENCE BIT

This application claims priority under 35 USC §119(e)(1) of provisional application Ser. No. 60/025,105, filed Aug. 30, 1996.

TECHNICAL FIELD OF THE INVENTION

This invention relates in general to the field of electronic circuits, and more particularly to a circuit and process for autotrim of an embedded threshold voltage reference bit

BACKGROUND OF THE INVENTION

Integrated circuit chips that contain FAMOS (floating gate avalanche metal oxide semiconductor) cells, such as a flash EPROM (erasable programmable read only memory) or an EEPROM chip, can use FAMOS cells to provide embedded threshold voltage reference bits. Typically, such bits comprise cells whose threshold voltages are trimmable to precise values. These FAMOS cells, once trimmed, can be used to provide one or more on-chip reference voltages. They can also be used to store other information such as storing more than one data for use in multi-level programming.

Conventional embedded threshold voltage reference bits are typically trimmed to their desired value by a manual method. This manual method requires a tester for the chip first to program the bit using an externally-timed program mode. The tester then reads the bit's threshold voltage using a threshold voltage read mode. If the threshold voltage is too high, the tester applies an erase pulse using an externally-timed erase mode. The tester then continues the process of reading the threshold voltage and erasing until the threshold voltage reaches the desired value.

This conventional manual method for setting embedded threshold voltage reference bits suffers from a number of problems including the fact that the process contains many iterative steps, is time consuming, and allows each tester only to trim one bit at a time.

SUMMARY OF THE INVENTION

In accordance with the present invention, a circuit and process for autotrim of an embedded threshold voltage reference bit are provided that substantially reduce or eliminate problems and disadvantages of prior circuits and methods for trimming embedded threshold voltage reference bits.

According to one embodiment of the present invention, a circuit and method for autotrim of an embedded threshold voltage reference bit are provided. A FAMOS cell in an integrated circuit chip provides the embedded threshold voltage reference bit. The FAMOS cell is first programmed to a threshold voltage above a desired threshold voltage. The FAMOS cell is then erased to lower the threshold voltage. After erasing, the FAMOS cell is tested to determine whether the threshold voltage is at a desired voltage level. The erasing and testing are accomplished automatically as an on-chip process in an integrated circuit chip. The testing can be based upon a comparison with an output of an internal reference generator that is responsive to the embedded threshold voltage reference bit. The testing can also be based upon a comparison to an external voltage input or an internal voltage reference..

A technical advantage of the present invention is the ability to read and erase an embedded threshold voltage reference bit using an on-chip process so that a tester need only apply an autotrim command and, depending upon the implementation, an input voltage reference in order to trim the bit.

Another technical advantage of the present invention is the autotrim of an embedded threshold voltage reference bit based upon the output of a reference circuit that uses the reference bit as a basis for the voltage generated. The embedded threshold voltage reference is trimmed until the output of the reference circuit reaches the desired value.

DESCRIPTION OF THE DRAWINGS

A more complete understanding of the present invention and advantages thereof may be acquired by referring to the following description taken in conjunction with the accompanying drawings in which like reference numbers indicate like features, and wherein.

DETAILED DESCRIPTION OF THE INVENTION

Figure 1:
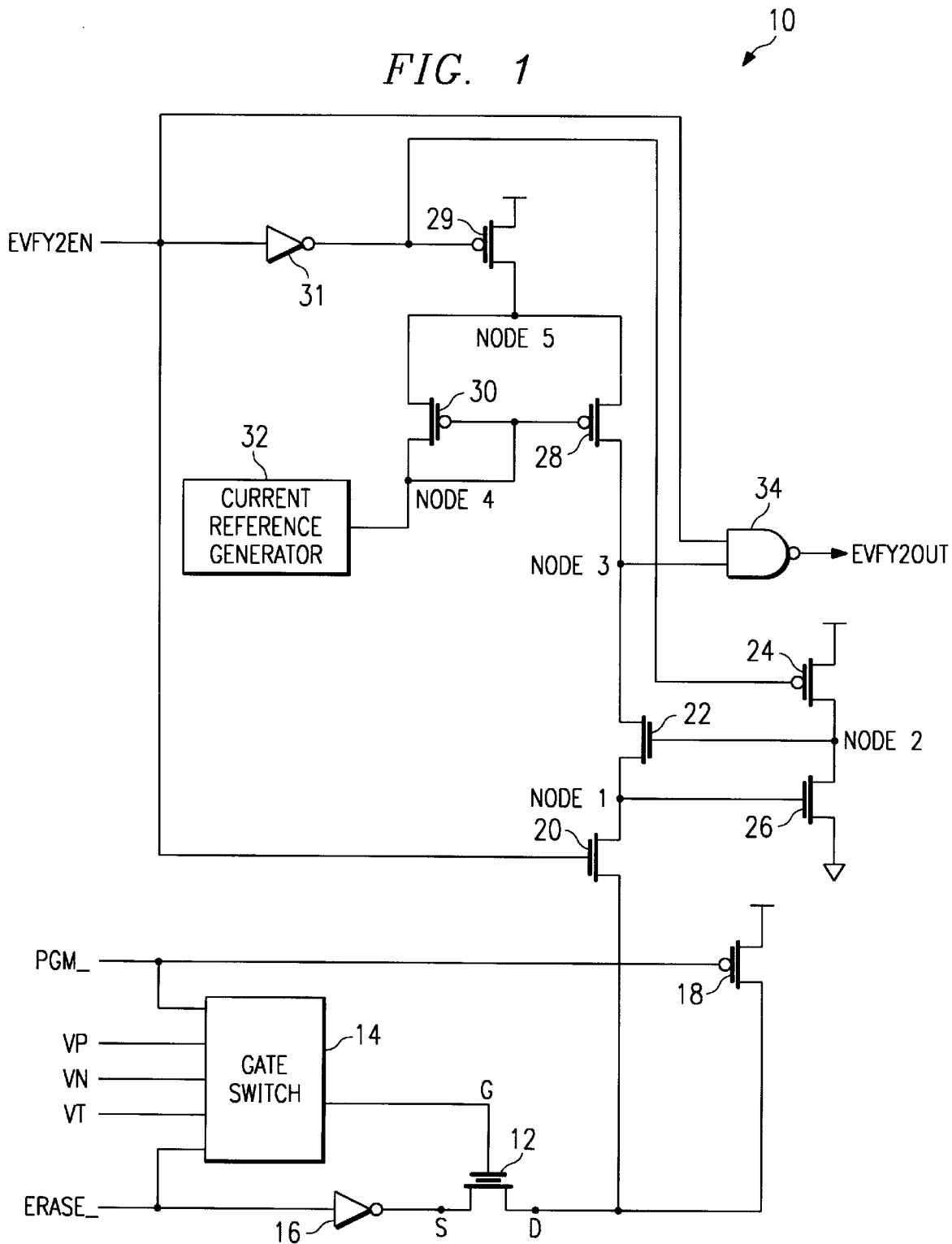
FIG. 1 is a diagram of one embodiment of a circuit for autotrim of an embedded threshold voltage reference bit constructed according to the teachings of the present invention.

FIG. 1 is a diagram of one embodiment of a circuit, indicated generally at 10, for autotrim of an embedded threshold voltage reference bit constructed according to the teachings of the present invention. The embodiment of FIG. 1 provides a circuit for setting a bit where the bit can then be used directly as a reference in an integrated circuit chip of which circuit 10 is a part. For example, the reference bit can be used to verify the erasing of an array of memory cells in a flash EPROM or an EEPROM device.

In circuit 10, a FAMOS cell 12 has a gate, source and drain, as shown. Cell 12 provides the embedded threshold voltage reference bit that is set by circuit 10 according to the teachings of the present invention. The gate of cell 12 is connected to a gate switch 14 which receives a number of inputs. Gate switch 14 receives a program signal, PGM_, and an erase signal, ERASE_. Gate switch 14 also can receive a positive voltage, VP, a negative voltage, VN, and a threshold voltage, VT. Gate switch 14 operates to connect the gate of cell 12 to one of the voltage inputs, or other appropriate voltage reference (e.g., ground potential), responsive to the state of circuit 10.

The erase signal, ERASE_, is received by an inverter 16 which has its output connected to the source of cell 12. The program signal, PGM_, is received by the gate of a p-channel transistor 18. The source of p-channel transistor 18 is connected to a voltage supply, and the drain of the p-channel transistor is connected to the drain of cell 12. An n-channel transistor 20 has a source connected to the drain of cell 12, a gate that receives an erase/verify enable signal, EVFY2EN, and a drain connected to a first node, NODE 1. A second n-channel transistor 22 has a source connected to NODE 1, a gate connected to a second node, NODE 2, and a drain connected to a third node, NODE 3. A p-channel transistor 24 has a drain connected to NODE 2, a gate connected to the output of inverter 31, and a source connected to the supply voltage. An n-channel transistor 26 has a drain connected to NODE 2, a source connected to ground potential, and a gate connected to NODE 1. When not in use, P-channel transistor 24 is turned off by the output of inverter 31.

A current mirror circuit is formed by p-channel transistor 28 and p-channel transistor 30. The drain of p-channel transistor 28 is connected to NODE 3, the gate is connected to a fourth node, NODE 4, and the source is connected to a fifth node, NODE 5. P-channel transistor 30 has a source connected to NODE 5, a gate connected to NODE 4, and a drain connected to NODE 4. A p-channel transistor 29 has a drain connected to NODE 5 and a source connected to the supply voltage. The gate of p-channel transistor is connected to the output of an inverter 31. Inverter 31 receives the erase/verify enable signal, EVFY2EN, as an input. Inverter 31 and p-channel transistor 29 operate to conserve current by turning off when the erase/verify enable signal, EVFY2EN, is not asserted.

A current reference generator 32 is connected to and provides current to NODE 4. Current reference generator operates to supply a current reference responsive to the state of circuit 10. One embodiment of current reference generator 32 is shown in and described with respect to FIG. 3. A NAND gate 34 has one input connected to NODE 3. The other input of NAND gate 34 receives the erase/verify enable signal, EVFY2EN. NAND gate 34 provides an erase/verify output signal, EVFY2OUT, based upon the inverse of the logical AND of the voltage level of NODE 3 and the erase/verify enable signal, EVFY2EN. The erase/verify output signal, EVFY2OUT, can be fed to a status register in the integrated circuit chip to indicate the status of the trimming of cell 12.

Autotrim of the embedded threshold voltage reference bit provided by cell 12 is accomplished using the program signal, PGM_, the erase signal, ERASE_, and the erase/verify enable signal, EFVY2EN. When the program signal, PGM_, is asserted, the positive voltage, VP, is connected to the gate of cell 12 by gate switch 14. In one embodiment, the positive voltage, VP, is equal to twelve volts. In addition, when the program signal, PGM_, is asserted, the drain of cell 12 is driven to the positive supply voltage by p-channel transistor 18 being turned on. In this condition, circuit 10 causes cell 12 to experience a program pulse so the threshold voltage of cell 12 is increased.

When the erase signal, ERASE_, is asserted, the negative voltage, VN, is connected to the gate of cell 12 by gate switch 14. In one embodiment, the negative voltage, VN, is equal to minus eight volts. When the erase signal, ERASE_, is asserted, the source of cell 12 is driven to the positive supply voltage by the logic high output of inverter 16. In this condition, circuit 10 causes cell 12 to experience an erase pulse so the threshold voltage of cell 12 is reduced.

When the erase/verify enable signal, EVFY2EN, is asserted, a small current, generated by current reference generator 32, is applied to the drain of cell 12. The gate of cell 12 is then connected to the positive voltage, VP, which either provides an external test input voltage or provides an internal reference such as the threshold voltage of an n-channel transistor. If cell 12 is sufficiently erased, cell 12 will sink all of the applied small current. This will pull down NODE 3 and cause the erase/verify output signal, EVFY2OUT, to go high. When the erase/verify output signal, EVFY2OUT, is high, it signals the completion of the autotrim process. If cell 12 is not sufficiently erased, cell 12 will not sink all of the applied small current. This will keep NODE 3 at the positive power supply and cause the erase/verify output signal, EVFY2OUT, to go low which signals that further erasing is needed.

The process for autotrim of the embedded threshold voltage reference bit provided by cell 12 begins with the program signal, PGM_, being asserted in order to pre-program the threshold voltage of cell 12. The erase signal, ERASE_, is then asserted in an iterative manner in order to erase the threshold voltage of cell 12 to the desired value. The erase/verify output signal, EVFY2OUT, signals whether an additional erase pulse is needed or whether the process has completed. According to the present invention, this process is carried out automatically by the integrated circuit chip after receiving a command to perform the autotrim process.

Figure 2:
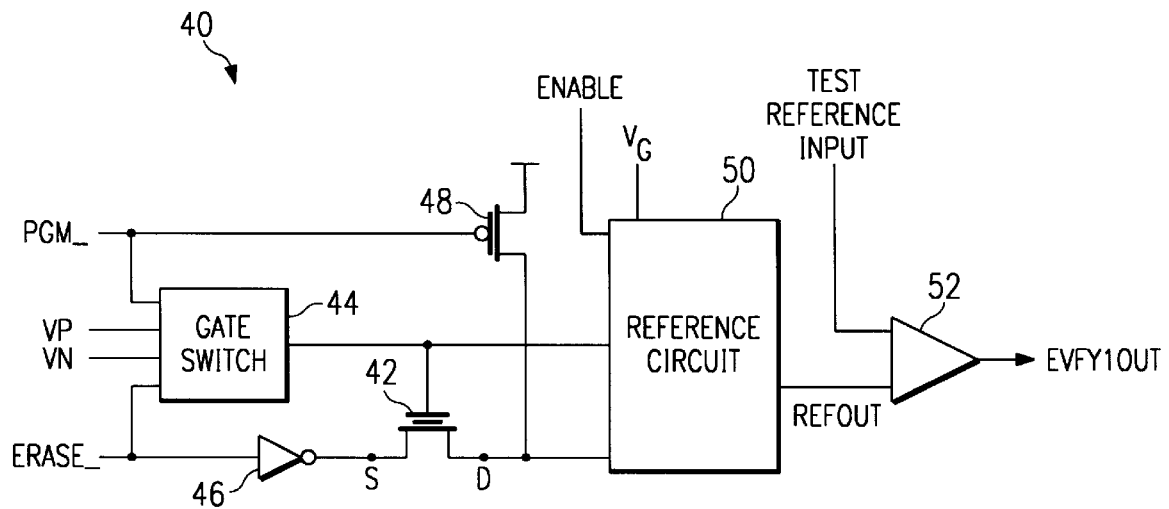
FIG. 2 is a diagram of another embodiment of a circuit for autotrim of an embedded threshold voltage reference bit constructed according to the teachings of the present invention.

FIG. 2 is a diagram of another embodiment of a circuit, indicated generally at 40, for autotrim of an embedded threshold voltage reference bit constructed according to the teachings of the present invention. The embodiment of FIG. 2 provides a circuit for setting a bit that is then used by a reference circuit to generate a reference voltage for use in an integrated circuit chip of which circuit 40 is a part. For example, the generated reference voltage can be used to drive pumps for the source of cells in a memory array on an EPROM device.

In circuit 40, a FAMOS cell 42 has a gate, source and drain, as shown. The gate of cell 42 provides the embedded threshold voltage reference bit that is set by circuit 40 according to the teachings of the present invention. The gate of cell 42 is connected to a gate switch 44 which receives a number of inputs. Gate switch 44 receives a program signal, PGM_, and an erase signal, ERASE_. Gate switch 44 can also receive a positive voltage, VP, and a negative voltage, VN. Gate switch 44 operates to connect the gate of cell 42 to one of the voltage inputs, or other appropriate voltage reference (e.g., ground potential), responsive to that state of circuit 40.

The erase signal, ERASE_, is received by an inverter 46 which has its output connected to the source of cell 42. The program signal, PGM_, is received by the gate of a p-channel transistor 48. The source of p-channel transistor 48 is connected to a voltage supply, and the drain of the p-channel transistor is connected to the drain of cell 42. A reference circuit 50 is connected to the gate and the drain of cell 42, as shown. Reference circuit 50 also receives an enable signal, ENABLE, and a voltage reference, VG.

Reference circuit 50 operates to provide an output voltage reference, REFOUT, that is responsive to the difference between the threshold voltage of cell 42 and the voltage reference, VG. A comparator 52 receives as inputs the output voltage reference, REFOUT, and a test reference voltage, TEST REFERENCE INPUT. Comparator 52 then produces an erase/verify output signal, EVFY1OUT. This signal is high if the output voltage reference, REFOUT, substantially matches the test reference voltage, TEST REFERENCE INPUT. Otherwise the erase/verify output signal, EVFY1OUT, is low. The erase/verify output signal, EVFY1OUT, can be fed to a status register to indicate the status of the setting of the threshold voltage for cell 42.

Autotrim of the embedded threshold voltage reference bit provided by cell 42 is accomplished using the program signal, PGM_, the erase signal, ERASE_, and the enable signal, ENABLE. When the program signal, PGM_, is asserted, the positive voltage, VP, is connected to the gate of cell 42 by gate switch 44. In one embodiment, the positive voltage, VP, is equal to twelve volts. In addition, when the program signal, PGM_, is asserted, the drain of cell 42 is driven to the positive supply voltage by p-channel transistor 48 being turned on. In this condition, circuit 40 causes cell 42 to experience a program pulse so the threshold voltage of cell 42 is increased.

When the erase signal, ERASE__, is asserted, the negative voltage, VN, is connected to the gate of cell 42 by gate switch 44. In one embodiment, the negative voltage, VN, is equal to minus eight volts. When the erase signal, ERASE__, is asserted, the source of cell 42 is driven to the positive supply voltage by the logic high output of inverter 46. In this condition, circuit 40 causes cell 42 to experience an erase pulse so the threshold voltage of cell 42 is reduced.

When the enable signal, ENABLE, is asserted, reference circuit 50 operates in its normal mode. In this normal mode, reference circuit 50 produces the output reference voltage, REFOUT, based upon the voltage, VG, and the threshold voltage of cell 42. Comparator 52 compares this output voltage, REFOUT, to the test reference voltage, TEST REFERENCE INPUT. If the output of reference circuit 50 is correct, then the erase/verify output signal, EVFY1OUT, is a logic high. If the erase/verify output signal, EVFY1OUT, is a logic low, then the threshold voltage of cell 42 needs to be erased further.

The process for autotrim of the embedded threshold voltage reference bit provided by cell 42 begins with the program signal, PGM__, being asserted in order to pre-program the threshold voltage of cell 42. The erase signal, ERASE__, is then asserted in an iterative manner in order to erase the threshold voltage of cell 42 to the desired value. The erase/verify output signal, EVFY1OUT, signals whether an additional erase pulse is needed or whether the process has completed.

Figure 3:
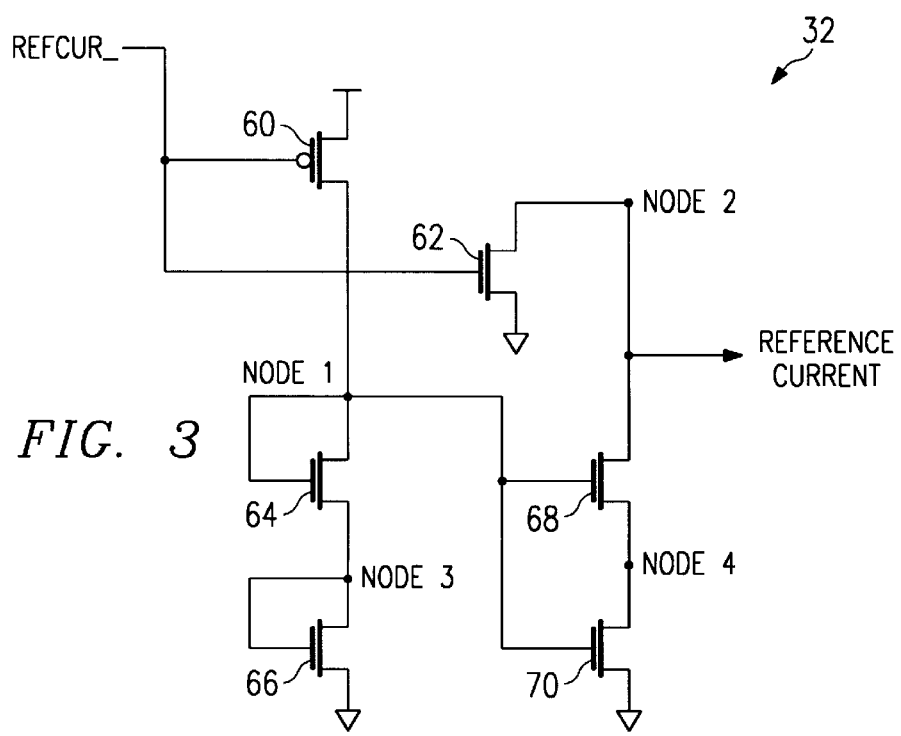
FIG. 3 is a diagram of one embodiment of the current reference generator in the circuit of FIG. 1.

FIG. 3 is a diagram of one embodiment of current reference generator 32 of FIG. 1. Current reference generator 32 provides a current, REFERENCE CURRENT, used as a reference during the setting of cell 12 in the embodiment of FIG. 1. As shown in FIG. 3, current reference generator 32 includes a p-channel transistor 60 that has a source connected to the power supply voltage, a drain connected to a first node, NODE 1, and a gate. The gate receives a reference current signal, REFCUR__. Current reference generator 32 also includes an n-channel transistor 62 that has a drain connected to a second node, NODE 2, a source connected to ground potential, and a gate that receives the reference current signal, REFCUR__. An n-channel transistor 64 has a drain connected to NODE 1, a gate connected to NODE 1, and a source connected to a third node, NODE 3. Another n-channel transistor 66 has a drain connected to NODE 3, a gate connected to NODE 3, and a source connected to ground potential. An n-channel transistor 68 has a drain connected to NODE 2, a gate connected to NODE 1, and a source connected to a fourth node, NODE 4. A further n-channel transistor 70 has a drain connected to NODE 4, a gate connected to NODE 1, and a source connected to ground potential. Current reference generator 32 provides the small current to the drain of cell 12 that is sunk by cell 12 when set to the proper level.

According to the present invention, the threshold voltage reference bits provided by cell 12 and cell 42 are autotrimmed to desired values by an on-chip automatic process. The process can be implemented such that a tester pre-programs the reference bit and then allows the chip to erase the reference bit to the desired value. The process can also be implemented such that the chip can apply the pre-programmed pulse automatically. As another alternative, the chip can apply a sequence of short programming pulses, possibly with a controlled gate voltage, in such a fashion that the threshold voltage is programmed up to its desired value. However, it is typically possible to erase more precisely than to program, thus precision erasing is generally favored over precision programming.

An integrated circuit chip constructed according to the present invention to autotrim the embedded threshold voltage reference bit can include a manual program mode which can be used by the tester to assure the threshold voltage of the reference bit is not less than a target threshold voltage. This manual program mode can be accomplished by one program pulse. Another feature is a simple sensing circuit, as shown in FIG. 1, that applies a current reference to the drain of the FAMOS cell while a voltage reference (e.g., the target threshold voltage) is applied to the FAMOS gate. As shown in FIG. 1, the drain of the FAMOS cell is also coupled to a logic gate, such as NAND gate 34, so that the output of the gate reflects whether or not the reference cell conducts. A further feature is an input through which the tester can apply a test voltage reference. For the embodiment of FIG. 1, this test voltage reference is equal to the desired threshold voltage, VT, of the bit, and the voltage is applied to the gate of cell 12. In the embodiment of FIG. 2, this input is compared to the output of a voltage reference generator that operates responsive to the setting of the gate of cell 42.

The present invention can be implemented, for example, on a flash EPROM or an EEPROM chip. In this implementation, the chip can use a normal erase routine for autotrim where some aspects are modified by special test logic so that the command state machine and the write state machine of the chip are not altered for the sake of setting an embedded threshold voltage reference bit. In this sense, the present invention provides a simplified design which adds gate, source and drain switches, a sense circuit, and special test logic as well as the reference voltage input to a conventional EPROM device. However, one aspect of use in a flash EPROM or EEPROM chip is that, to erase with precision, each erase pulse may need to be relatively short. Many pulses would then be needed, thus requiring a high pulse limit in the on-chip erase process or possibly needing the tester to apply an autotrim command more than once, until a pass occurs.

Although the present invention has been described in detail, it should be understood that various changes, substitutions and alterations can be made thereto without departing from the spirit and scope of the invention as defined by the appended claims.

What is claimed is:

1. A circuit for autotrim of an embedded threshold voltage reference bit, comprising:

a FAMOS cell having a gate, a source and a drain, the FAMOS cell providing an embedded threshold voltage reference bit;

a gate switch connected to the gate of the FAMOS cell and connected to receive a program signal and an erase signal, the gate switch operable to connect the gate of the FAMOS cell to a positive voltage when the program signal is in an asserted state and to a negative voltage when the erase signal is in an asserted state, wherein the gate switch is further operable to connect the gate of the FAMOS cell to a desired threshold voltage when an erase/verify enable signal is in an asserted state;

a current reference generator operable to provide a test current, the current reference generator coupled to the drain of the FAMOS cell such that the current generator provides the test current to the drain of the FAMOS cell when the erase/verify signal is in the asserted state; and a logic gate connected to receive the erase/verify enable signal as a first input, and the logic gate coupled to the drain of the FAMOS cell such that the logic gate receives the voltage level of the drain of the FAMOS cell as a second input when the erase/verify signal is in the asserted state, such that the logic gate provides an erase/verify output signal indicating whether the FAMOS cell turns on when the erase/verify signal is enabled;

the erase signal coupled to the source of the FAMOS cell such that the source of the FAMOS cell is driven to a positive voltage level when the erase signal is in the asserted state;

the program signal coupled to the drain of the FAMOS cell such that the drain of the FAMOS cell is driven to a positive voltage level when the program signal is in the asserted state; and the circuit thereby operable to automatically trim the threshold voltage of the FAMOS cell using the program signal to program the FAMOS cell, the erase signal to erase the FAMOS cell, and the erase/verify enable signal to test the FAMOS cell.

2. The circuit of claim 1, wherein the program signal is coupled to the drain of the FAMOS cell through a p-channel transistor.

3. The circuit of claim 1, wherein the erase signal is coupled to the source of the FAMOS cell through an inverter.

4. The circuit of claim 1, wherein the current reference generator is coupled to the drain of the FAMOS cell through a current mirror circuit and an n-channel transistor.

5. The circuit of claim 1, wherein the erase/verify signal is coupled to the drain of the FAMOS cell through an n-channel transistor.

6. The circuit of claim 1, wherein the logic gate comprises a NAND gate.

7. A circuit for autotrim of an embedded threshold voltage reference bit, comprising:

a FAMOS cell having a gate, a source and a drain, the FAMOS cell providing an embedded threshold voltage reference bit;

a gate switch connected to the gate of the FAMOS cell and connected to receive a program signal and an erase signal, the gate switch operable to connect the gate of the FAMOS cell to a positive voltage when the program signal is in an asserted state and to a negative voltage when the erase signal is in an asserted state;

a reference circuit connected to the gate and the drain of the FAMOS cell, the reference circuit connected to receive an enable signal and a voltage reference, wherein the reference circuit is operable to generate a voltage reference output based upon the voltage reference and the threshold voltage of the FAMOS cell; and a comparator connected to receive as inputs the voltage reference output of the reference circuit and a test reference input, the comparator operable to produce an erase/verify output signal based upon comparing the voltage reference output and the test reference input;

the erase signal coupled to the source of the FAMOS cell such that the source of the FAMOS cell is driven to a positive voltage level when the erase signal is in the asserted state;

the program signal coupled to the drain of the FAMOS cell such that the drain of the FAMOS cell is driven to a positive voltage level when the program signal is in the asserted state; and the circuit thereby operable to automatically trim the threshold voltage of the FAMOS cell using the program signal to program the FAMOS cell, the erase signal to erase the FAMOS cell, and the enable signal to test the FAMOS cell.

8. The circuit of claim 7, wherein the program signal is coupled to the drain of the FAMOS cell through a p-channel transistor.

9. The circuit of claim 7, wherein the erase signal is coupled to the source of the FAMOS cell through an inverter.

10. A method for autotrim of an embedded threshold voltage reference bit, comprising:

programming a FAMOS cell to a threshold voltage above a desired threshold voltage, the FAMOS cell providing an embedded threshold voltage reference bit;

erasing the FAMOS cell to lower the threshold voltage; and testing the FAMOS cell to determine whether the threshold voltage is at a desired voltage level;

wherein at least erasing and testing are accomplished automatically as an on-chip process in an integrated circuit chip.

11. The method of claim 10, wherein the testing is based upon a comparison with an output of an internal reference circuit that is responsive to the embedded threshold voltage reference bit.

12. The method of claim 11, wherein the testing is based upon a comparison to an external voltage input.

13. The method of claim 11, wherein the testing is based upon a comparison to an internal voltage reference.

* * * * *